United States Patent
Chuang et al.

(10) Patent No.: US 6,854,100 B1
(45) Date of Patent: Feb. 8, 2005

(54) METHODOLOGY TO CHARACTERIZE METAL SHEET RESISTANCE OF COPPER DAMASCENE PROCESS

(75) Inventors: Harry Chuang, Austin, TX (US); Victor C. Y. Chang, Tucheng (TW); Yung-Shun Chen, Hsin-Chu (TW); Shang Y. Hou, Hsinchu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 0 days.

(21) Appl. No.: 10/228,496

(22) Filed: Aug. 27, 2002

(51) Int. Cl.$^7$ .............................................. G06F 17/50
(52) U.S. Cl. ................................. 716/5; 716/4; 716/6
(58) Field of Search .................... 716/1–21; 438/14–19, 438/626

(56) References Cited

U.S. PATENT DOCUMENTS

| | | | |
|---|---|---|---|
| 6,162,728 A * | 12/2000 | Tsao et al. | 438/687 |
| 6,243,653 B1 | 6/2001 | Findley | 702/65 |
| 6,312,963 B1 | 11/2001 | Chou et al. | 438/18 |
| 6,381,730 B1 | 4/2002 | Chang et al. | 716/5 |
| 6,514,853 B1 * | 2/2003 | Matsubara | 438/626 |
| 6,539,526 B1 * | 3/2003 | Deng | 716/5 |
| 6,542,834 B1 * | 4/2003 | Dixit | 702/65 |
| 6,587,991 B1 * | 7/2003 | Mbouombouo et al. | 716/2 |
| 6,588,002 B1 * | 7/2003 | Lampaert et al. | 716/8 |
| 6,591,407 B1 * | 7/2003 | Kaufman et al. | 716/10 |
| 6,606,732 B2 * | 8/2003 | Buffet et al. | 716/4 |
| 6,625,006 B1 * | 9/2003 | Aram et al. | 361/313 |
| 6,643,831 B2 * | 11/2003 | Chang et al. | 716/4 |
| 2002/0040465 A1 * | 4/2002 | Kimura et al. | 716/5 |

OTHER PUBLICATIONS

Smith et al., "Evaluation of Sheet Resistance and Electrical Linewidth Measurement Techniques for Copper Damascene Interconnect," IEEE, May 2002, pp. 214–222.*

Smith et al., "Evaluation of the Issue Involved with Test Structures for the Measurement of Sheet Resistance and Linewidth of Copper Damascene Interconnect," IEEE, Mar. 2001, pp. 195–200.*

* cited by examiner

*Primary Examiner*—Vuthe Siek
(74) *Attorney, Agent, or Firm*—Thomas, Kayden, Horstemeyer & Risley

(57) ABSTRACT

A new method to determine a parameter of a damascene interconnect in an integrated circuit device is achieved. Drawn dimensions and local pattern density of a damascene interconnect are extracted in an integrated circuit device. A parameter of the damascene interconnect is calculating using the drawn dimensions and the local pattern density to select a per unit value from a set of per unit values measured over a range of drawn dimension and pattern density combinations. The method may be used to improve the accuracy of extracted damascene metal line resistance and parasitic capacitance.

17 Claims, 5 Drawing Sheets

METHODOLOGY TO CHARACTERIZE METAL SHEET RESISTANCE OF COPPER DAMASCENE PROCESS

BACKGROUND OF THE INVENTION (1) Field of the Invention

The invention relates to a method to determine a parameter of a damascene interconnect in an integrated circuit device and, more particularly, to a method to determine a parameter from a layout where the effects of dimension and local density, such as dishing, erosion, and optical proximity correction, are considered in the determination.

(2) Description of the Prior Art

As integrated circuit technology scales down, the impact of interconnect-induced delay becomes greater. That is, the parasitic resistance and capacitance (RC) of the interconnect system within the integrated circuit begins to play a greater role in the performance of the circuit. It is very important, therefore, that the parasitic RC components of the interconnect be modeled accurately.

Referring now to FIG. 1, a simplified top view of a partial, integrated circuit is shown. In this layout, two metal interconnect lines 18 and 19 are shown. Each line is formed in a common metal layer 10. Contact openings 14 are shown where each line 18 and 19 terminates at a coupling to an underlying element or interconnect, not shown. It is common in the art to use electronic design automation (EDA) to create these metal lines 18 and 19 to provide coupling between elements within a circuit layout.

EDA tools may be used to model the performance of the circuit or of sub-sections of the circuit. For example, simulators, such as SPICE, have long been used to model analog performance or critical timing paths in circuits. A simulator will use standard models for active circuit elements, such as MOS transistors. A network of active devices is linked in a netlist file such that the combined performance of the circuit components may be simulated. The effect of parasitic RC values in the interconnects between active elements is typically included if it is available.

EDA tools may be used to extract the parasitic RC values from the interconnect. Referring now to FIG. 2, the typical method 70 for determining the parasitic RC value is shown. First, the EDA tool analyzes the routing of one of the metal lines to extract the drawn dimensions in step 74. For example, the length and width of the metal routing 18 from point A to point B is measured from the layout data shown in FIG. 1. Referring again to FIG. 2, the drawn dimensions are then used to calculate the parasitic parameter, in this case the resistance, as shown. Note that the length (L) is divided by the width (W) to determine how many squares of the metal line are used in the routing. Next, the metal squares value is multiplied by a constant sheet resistance ($P_S$) value to derive the resistance. The sheet resistance is ohms/square value that is a constant for a given metal level for the integrated circuit process as is well known in the art.

Referring now to FIG. 3, a cross sectional view of the aforementioned integrated circuit layout is illustrated. Each of the metal lines 18 and 19 is shown. Several dielectric layers 20, 24, and 30, are shown. In addition, an underlying metal layer 26 is shown. The parasitic impedance values for the metal lines 18 and 19 are based on several factors. First, the widths (W1 and W2) of each line 18 and 19 are important. Typically, widths of features, such as metal lines, are carefully controlled by monitoring critical dimension (CD) structures that are on the included on each IC. Further, the widths W1 and W2 of metal lines 18 and 19 in the same metal layer 10 are controlled by the drawn dimensions. Second, the depths D1 and D2 of the metal lines 18 and 19 are important. It is not typically possible to monitor interconnect thickness using a CD technique. However, the combination of the width W1 and the thickness D1 of the metal line is important because the actual resistivity of the metal line is directly proportional to the cross sectional area defined by the width multiplied by the depth. The third important factor is the distance D3 between the top of the underlying metal line 26 and the metal line 18 under analysis. The amount of capacitive coupling between overlying metal lines depends directly on the distance D3 between these lines. A fourth important factor is the spacing (S1) between adjacent metal lines 18 and 19. The capacitive coupling between these lines 18 and 19 depends on this spacing.

In a typical EDA analysis of an integrated circuit layout, the tool makes several assumptions. First, the drawn dimensions W1 and W2 are equally effected by the manufacturing process. If the manufacturing process causes the width dimension of a metal line to increase or to decrease, then this increase or decrease amount will be consistent for all of the metal lines. For example, a drawn width W1 of line 18 is 0.5 microns. After processing, the actual CD value is measured at 0.45 microns. It is assumed that the width W2 of another metal line 19 in the same metal layer 10 will likewise lose 0.05 microns from the drawn dimension to the physical value. The EDA tool may add a positive or negative bias amount to the drawn dimensions to account for the process effect. However, this is done globally for all of the metal lines of the layer. The EDA extraction tool also assumes that all of the metal lines 18 and 19 in a metal layer 10 have the same depth or thickness such that D1=D2. Finally, the EDA tool assumes that the depth or distance D3 between metal levels 10 and 26 is a constant value.

By using the above stated assumptions, the EDA tool can determine the parasitic RC parameters by simply extracting the drawn dimensions and then multiplying the results by constant per unit values of sheet resistance (ohms/square) or of capacitance (Farads/cm$^2$). However, the assumption of uniformity may not be valid.

Referring now to FIG. 4, a cross section of an integrated circuit device is shown. Two metal lines 34 and 36 are formed in a common metal layer 10. In this case, a first metal line 34 is designed to a much larger width than the than the second metal line 36. In this case, the metal lines 34 and 36 are formed using a damascene process. In a damascene process, interconnect lines are formed by etching trenches in the dielectric layer 20, depositing metal 10, and then polishing down the metal to define the metal lines 34 and 36. Damascene processes are particularly useful for forming copper-based interconnects since difficult copper etching is avoided.

In the cross section, a copper dishing effect is shown on one of the metal lines 34. Dishing occurs when the chemical mechanical polishing (CMP) operation removes excessive copper on a metal line 34 to cause a dish shaped profile. Generally, dishing occurs on relatively wide metal lines 34 where the selectivity of the CMP process to copper causes the copper removal rate to be accelerated. Of particular importance to the present invention is the fact that the depth or thickness D1 of the metal line 34 is affected. The dishing effect causes the thickness D1 of the large metal line 34 to be significantly less than the thickness D2 of the small metal line 36. The uniform thickness assumption is violated. An EDA tool that determines the resistivity using a constant resistivity value, based on the standard thickness D2, will understate the resistance value of the first metal line 34.

Referring now to FIG. 5, a second problem situation is shown. In this case, an array of closely-spaced metal lines 40 is formed in one area of the integrated circuit while a single metal line 42 is formed in another area. All of the lines 40 and 42 are drawn to the same dimension in the layout. However, the single line 42 exhibits a smaller physical width W2 than the width W1 of the closely-spaced lines 40. The difference in line sizes is due to optical proximity correction (OPC). To define the line trenches in the dielectric layer 20, a photoresist layer, not shown, is exposed to light through an optical mask. Adjacent features on the mask can create light interference that is transferred onto the photoresist pattern. It is found that closely-spaced features will tend to be over-exposed. For this reason, the closely-spaced trench lines 40 may be etched to a larger size than a single trench 42. Some type of biasing technique may be used to correct for overetched line sizes. However, this biasing is performed globally across the entire circuit. Therefore, it is found that OPC will cause significant differences in the physical dimensions of the same-dimensioned, final damascene lines due to variation in the local density of features. This variation in physical widths W1 and W2 will cause the standard EDA parameter extraction to be in error.

Referring now to FIG. 6, a third problem situation is shown. Again, a dense array of metal lines 50 are formed in one area of the device while a single metal line 52 is formed in another area. In this case, an erosion effect may occur in the closely-spaced, metal line region 50. In the erosion effect, significant dielectric layer 20 is lost. The resulting damascene metal lines 50 have a reduced thickness D1 when compared to the thickness D2 of the single metal line 52. If the EDA tool uses a constant value for the resistivity of the metal lines, then the results will be significantly in error.

Several prior art inventions relate to methods to extract parasitic impedance values from integrated circuit layouts. U.S. Pat. No. 6,381,730 B1 to Chang et al describes a parasitic extraction tool for use on an integrated circuit design. For a selected interconnect, parasitic impedance values, such as inductance, are extracted from the layout using an interconnect primitive library. U.S. Pat. No. 6,312,963 B1 to Chou et al discloses a method to derive estimates of physical interconnect process parameters from an IC layout. Test structures are fabricated and measured to determine values within a range of physical interconnect parameters. Scanning electron microscope measurements may also be used to derive parameters. This method discloses characterization of systematic variation of interconnect process parameters, such as line width and dielectric thickness. A line width, correction factor is a function of line width and space. An electric field solver method is used. U.S. Pat. No. 6,243,653 to Findley describes a parasitic parameter extraction method for use in an IC layout. Extraction of parasitic effects due to metal or polysilicon fill structures is described.

SUMMARY OF THE INVENTION

A principal object of the present invention is to provide an effective method to determine a parameter of a damascene interconnect in an integrated circuit device.

A further object of the present invention is to determine a parameter value of a damascene interconnect in an integrated circuit layout where drawn dimension and local pattern density effects on the process are considered.

A yet further object of the present invention is to determine a parameter from a layout by extracting drawn dimensions and local pattern density from the layout and then selecting a per unit value from a set of measure data based on a range of drawn dimensions and local pattern densities.

Another yet further object of the present invention is to provide a method to determine the resistance of a damascene metal line based on the drawn dimensions and the local pattern density where processing effects, such as dishing, erosion, and optical proximity correction, are taken into account.

Another yet further object of the present invention is to provide a method to determine the parasitic capacitance of a damascene metal line based on the drawn dimensions and the local pattern density where processing effects, such as dishing, erosion, and optical proximity correction, are taken into account.

In accordance with the objects of this invention, a method to determine a parameter of a damascene interconnect in an integrated circuit device is achieved. Drawn dimensions and local pattern density of a damascene interconnect are extracted in an integrated circuit device. A parameter of the damascene interconnect is calculating using the drawn dimensions and the local pattern density to select a per unit value from a set of per unit values measured over a range of drawn dimension and a pattern density combinations.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to determine a parameter of a damascene interconnect in an integrated circuit device is achieved. The method may be used to determine parasitic impedance of damascene metal lines based on characterization of the process over a range of drawn dimensions and local pattern densities. It should be clear to those experienced in the art that the present invention can be applied and extended without deviating from the scope of the present invention.

Figure 1:
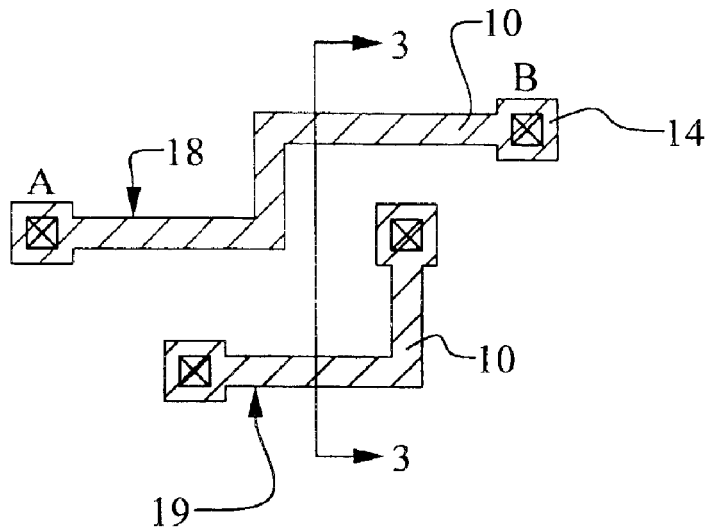
FIG. 1 illustrates a partial layout of an integrated circuit device showing metal interconnect.
Figure 2:
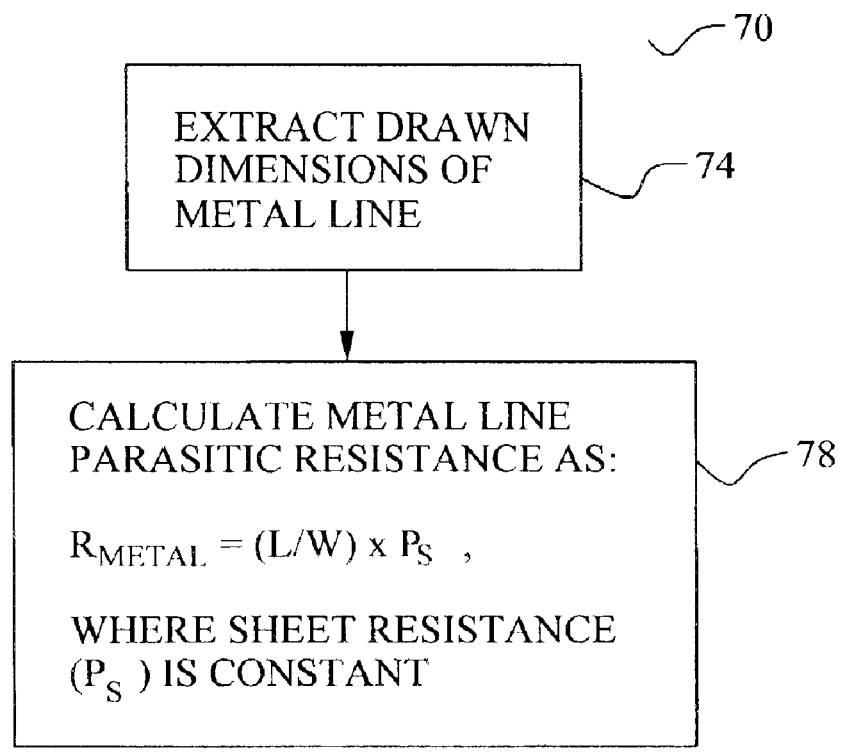
FIG. 2 illustrates the prior art method of determining metal line, parasitic resistance.
Figure 3:
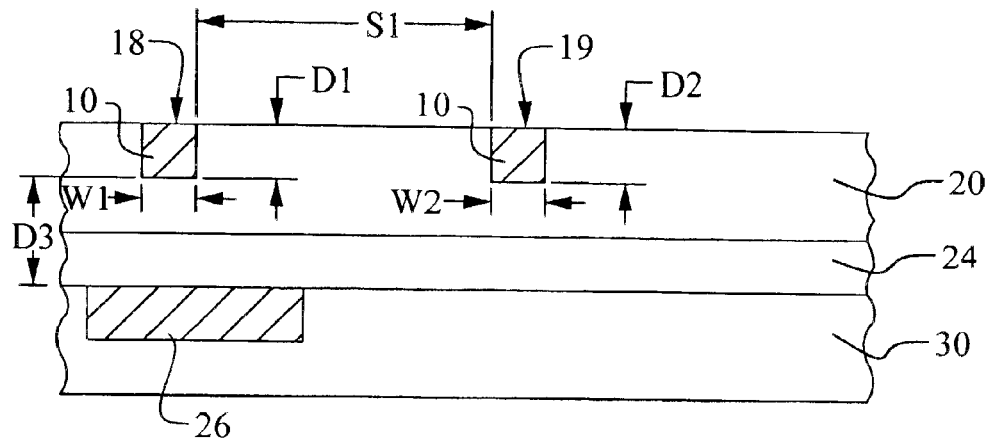
FIG. 3 illustrates a simplified cross section of the integrated circuit layout.
Figure 4:
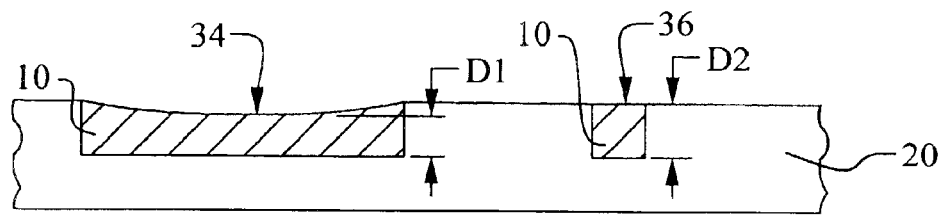
FIG. 4 illustrates a damascene interconnect showing the dishing effect.
Figure 5:
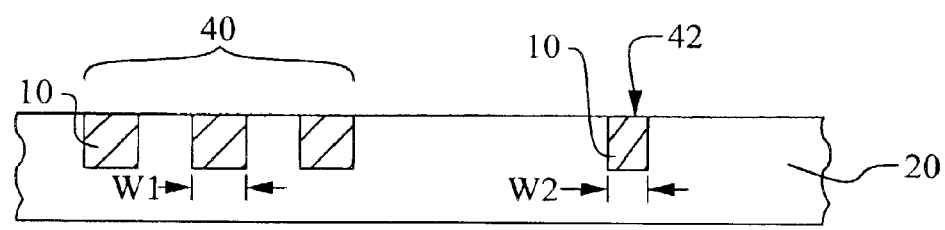
FIG. 5 illustrates a damascene interconnect showing the optical proximity correction (OPC) effect.
Figure 6:
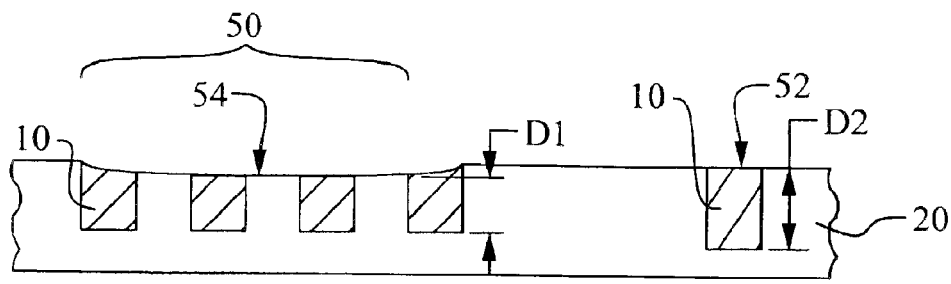
FIG. 6 illustrates a damascene interconnect showing the erosion effect.
Figure 7:
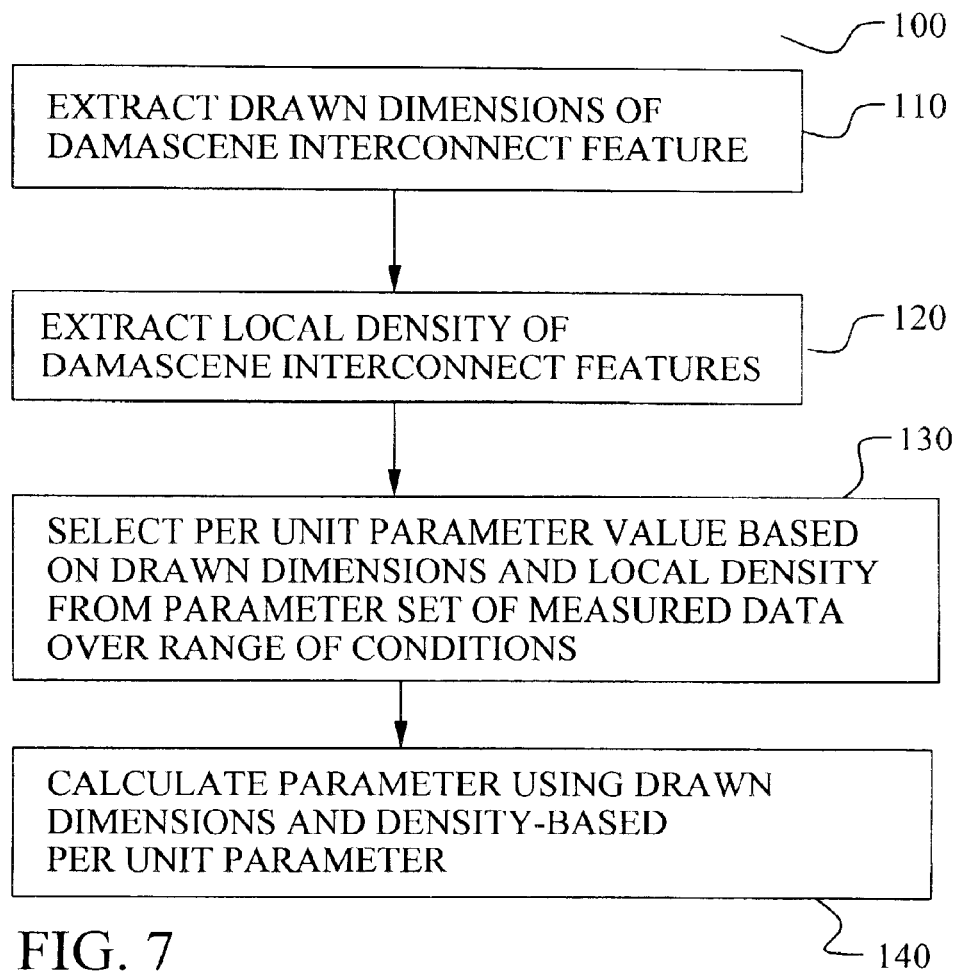
FIG. 7 illustrates the preferred embodiment of the present invention for determining a damascene interconnect, parasitic parameter.

Referring now to FIG. 7, the preferred embodiment of the present invention is illustrated. Several important features of the present invention are shown and discussed below. The method 100 to determine a parameter of a damascene interconnect in an integrated circuit comprises several steps. The parameter can be, for example, resistance, parasitic capacitance, joule heating, current density or combinations thereof. First, drawn dimensions and local pattern density of a damascene interconnect are extracted from an integrated circuit layout in steps 110 and 120. The metal line width and length are extracted from the layout as described for FIG. 1. Further, the local pattern density is extracted form the layout. The spacing between the damascene interconnect in question and the surrounding interconnects is extracted to determine the local density. The method therefore has access to the drawn width and spacing of the damascene line.

Next, in an important feature, the parameter of the damascene interconnect is calculating using the drawn dimensions and the local pattern density to select a per unit value from a set of per unit values measured over a range of drawn dimension and a pattern density combinations in steps 130 and 140.

More particularly, the integrated circuit process is characterized prior to the layout analysis. The characterization uses a set of test structures. Each test structure is formed with a specific damascene metal line width and space. The full set of test structures covers the range of useful width and space options. Further, the set of test structures is developed and tested for each of the major metal levels of the integrated circuit process. Referring now to Table 1 below, the test structure range is shown for first metal level, for intermetal levels, and for top metal level in an exemplary process.

TABLE 1

Test Structure Values for
Characterization of Damascene Process Effects.

| Metal Level | Spacing Values (microns) | Width Values (microns) |
|---|---|---|
| First Metal | 0.18, 0.21, 0.36, 0.5, 0.72, 1, 2, 3, 5, 7, 9, 10, 20 | 0.16, 0.32, 1, 1.5, 2, 3, 5, 7, 9, 10 |
| Intermetal | 0.21, 0.24, 0.42, 0.5, 0.63, 0.84, 1, 2, 3, 5, 7, 9, 10, 20 | 0.2, 0.4, 1, 1.5, 2, 3, 5, 7, 9, 10 |
| Top Metal | 0.46, 0.5, 0.92, 1, 1.38, 1.84, 2, 3, 4, 5, 7, 9, 10, 20 | 0.44, 0.88, 1, 1.5, 2, 3, 5, 7, 9, 10 |

The test structures are fabricated using the standard process of the integrated circuit device. Each of the structures is then measured for the per unit parameter. For example, the sheet resistance (ohms/square) of the metal line may be measured using known techniques, such as a four-point analysis. Alternatively, the parasitic capacitance (Farads/cm$^2$) of the structures may be measured. The measured data forms a set of per unit parametric values for each damascene metal level. Most importantly, a range of width and spacing combinations are characterized for each metal level. The above-described conditions for dishing, erosion, and OPC are established to varying degrees across the range of combinations.

Most importantly for the present invention, the drawn dimensions and local density are used to specify a particular range combination in the characterization data in step 130. For example, if the EDA tool extracts a drawn width of 0.32 microns and a drawn spacing of 0.5 microns for first metal layer line, then these are used to select the measured per unit parameter, such as resistivity, from the characterization data. This would represent a relatively narrow line width and spacing regime for first metal level where the effects of erosion or of OPC may be large. Conversely, another first metal line may have an extracted width of 10 microns and spacing of 10 microns. This metal line will exhibit the dishing effect. Other combinations of width and spacing may exhibit little of any of the above mentioned effects according to the characterization data.

The per unit value is selected based on the values of the drawn dimensions and local density. This selection may comprise a simple look-up table. Interpolation may be used to improve the accuracy of the data look-up as is well known in the art. Alternatively, the data may be converted into a mathematical equation using statistical analysis as is known in the art.

After the per unit value is selected from the characterization data, this per unit value is used to calculated the desired parameter in step 140. A much more accurate parameter is derived because a constant per unit value is replaced with a variable per unit value that depends on the dimension and density. This parameter may then be used in a simulation program, such as SPICE, to accurately account for parasitic effects.

Figure 8:
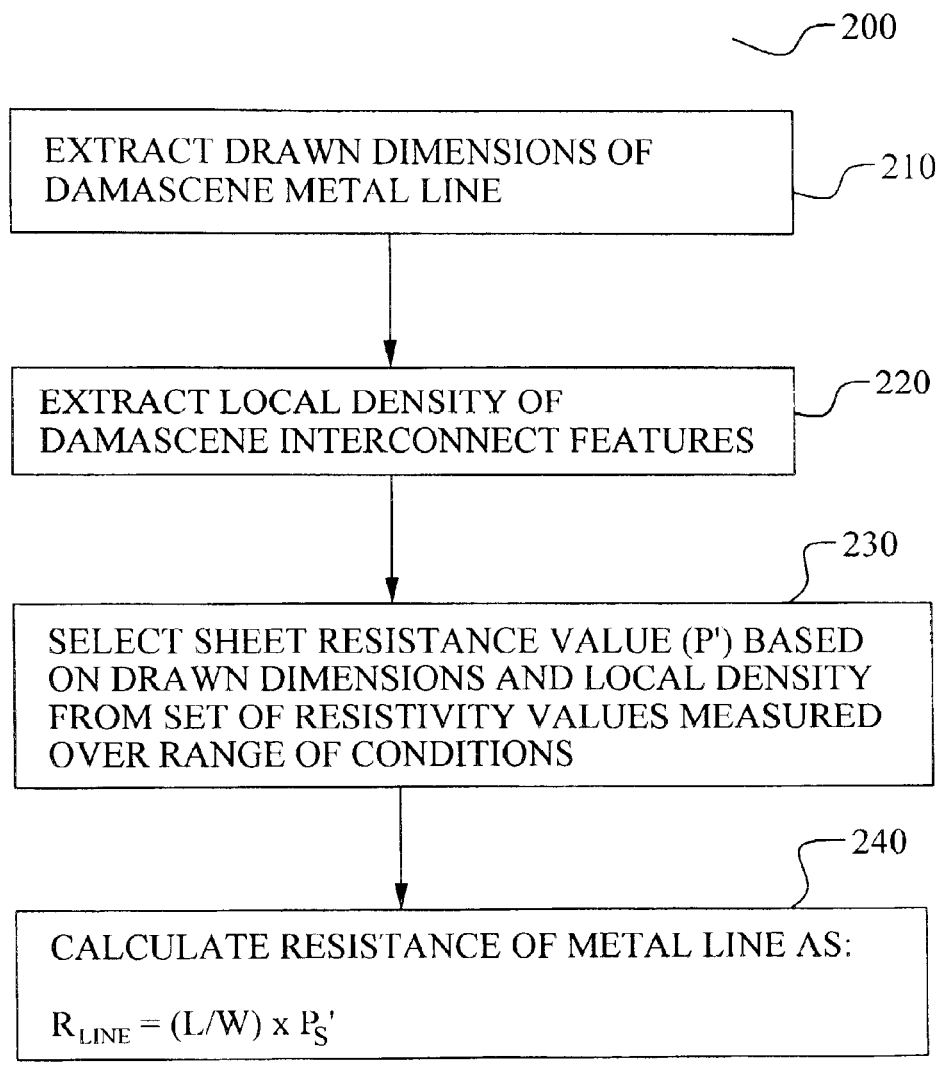
FIG. 8 illustrates the present invention for determining metal line resistance.

Referring now to FIG. 8, the method 200 is illustrated for the particular embodiment of determining the resistance of the damascene metal line. Again, the drawn dimensions and local density are extracted from the layout in steps 210 and 220. In step 230, the sheet resistance value ($P_s'$) is selected from the resistivity characterization data for the metal level. Finally, this particular sheet resistance value $P_s'$ is used to calculate an accurate damascene metal line resistance in step 240. The damascene metal line resistance ($R_{LINE}$) may be used for circuit simulation, such as SPICE, to improve the timing analysis of the circuit. Further, the method may be used to determine parameters such as joule heating and current density where the physical width and depth of the metal line is critical to the line performance.

Figure 9:
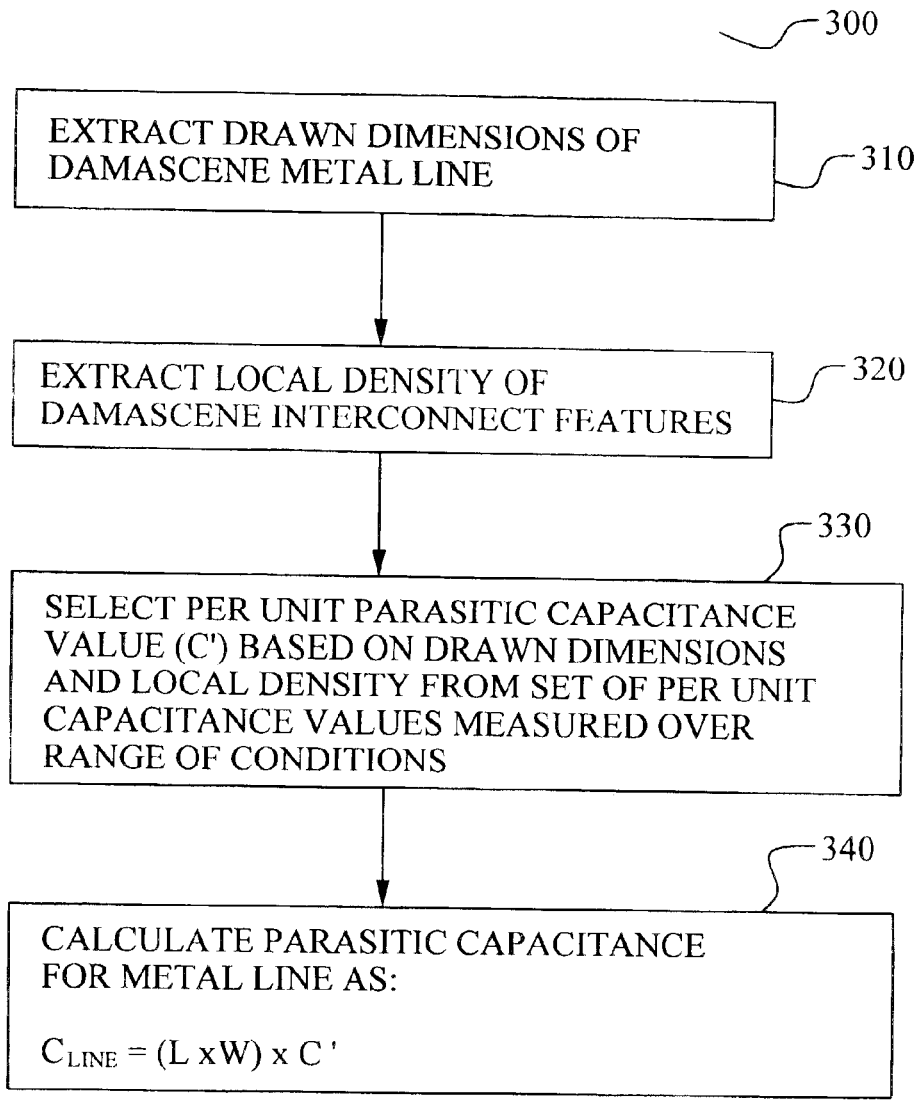
FIG. 9 illustrates the present invention for determining metal line capacitance.

Referring now to FIG. 9, the method of the present invention is illustrated for determining the parasitic capacitance of the damascene metal line 300. In steps 310 and 320, the drawn dimensions and local density are extracted from the layout. The drawn dimensions and local density are used to select the per unit capacitance (C') from the process characterization data. The effects of dishing, erosion, and OPC on the parasitic capacitance will thereby be included in the final calculation. Finally, the selected per unit capacitance (C') is used to calculate the parasitic capacitance in step 340. Again, this parasitic capacitance value ($C_{LINE}$) can then be used for circuit simulation.

The advantages of the present invention may now be summarized. An effective method to determine a parameter of a damascene interconnect in an integrated circuit device is achieved. The parameter value of the damascene interconnect in an integrated circuit layout is determined where drawn dimension and local pattern density effects on the process are considered. The parameter from is determined by extracting drawn dimensions and local pattern density from the layout and then selecting a per unit value from a set of measure data based on a range of drawn dimensions and local pattern densities. A method to determine the resistance or the parasitic capacitance of a damascene metal line, based on the drawn dimensions and the local pattern density, includes the processing effects of dishing, erosion, and optical proximity correction.

As shown in the preferred embodiments, the novel method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to determine a parameter of a damascene interconnect in an integrated circuit device, said method comprising:
   extracting drawn dimensions and local pattern density of a damascene interconnect in an integrated circuit device; and
   calculating a parameter of said damascene interconnect using said drawn dimensions and said local pattern density to select a per unit value from a set of said per unit values measured over a range of said drawn dimensions and a said pattern density combinations wherein said parameter is selected from the group consisting of: joule heating, current density and combinations thereof.

2. The method according to claim 1 wherein said per unit value varies according to a dishing effect on a metal line of said damascene interconnect.

3. The method according to claim 1 wherein said per unit value varies according to an erosion effect on a dielectric layer of said damascene interconnect.

4. The method according to claim 1 wherein said set of per unit values comprises a look-up table.

5. The method according to claim 1 wherein said set of per unit values comprises a mathematical formula.

6. The method according to claim 1 wherein said parameter is further used for circuit simulation of said integrated circuit device.

7. A method to determine a parameter of a damascene interconnect in an integrated circuit device, said method comprising:
   extracting drawn dimensions and local pattern density of a damascene interconnect in an integrated circuit device; and
   calculating a parameter of said damascene interconnect using said drawn dimensions and said local pattern density to select a per unit value from a set of said per unit values measured over a range of said drawn dimensions and a said pattern density combinations wherein said parameter is selected from: resistance, parasitic capacitance, joule heating, current density and combinations thereof,
   wherein said per unit value varies according to an optical pattern correction of a metal line of said damascene interconnect.

8. A method to determine a resistance of a damascene metal line in an integrated circuit device, said method comprising:
   extracting drawn dimensions and local pattern density of a damascene metal line in an integrated circuit device; and
   calculating a resistance of said damascene metal line using said drawn dimensions and said local pattern density to select a sheet resistance value from a set of said sheet resistance values measured over a range of said drawn dimensions and a said pattern density combinations wherein said sheet resistance value varies according to an optical pattern correction of said metal line.

9. The method according to claim 8 wherein said sheet resistance value varies according to a dishing effect on said metal line.

10. The method according to claim 8 wherein said sheet resistance value varies according to an erosion effect on a dielectric layer.

11. The method according to claim 8 wherein said set of sheet resistance values comprises a look-up table.

12. The method according to claim 8 wherein said set of sheet resistance values comprises a mathematical formula.

13. A method to determine a parasitic capacitance of a damascene metal line in an integrated circuit device, said method comprising:
    extracting drawn dimensions and local pattern density of a damascene metal line in an integrated circuit device; and
    calculating a parasitic capacitance of said damascene metal line using said drawn dimensions and said local pattern density to select a capacitance per unit value from a set of said capacitance per unit values measured over a range of said drawn dimensions and a said pattern density combinations wherein said capacitance per unit value varies according to an optical pattern correction of said metal line.

14. The method according to claim 13 wherein said capacitance per unit value varies according to a dishing effect on said metal line.

15. The method according to claim 13 wherein said capacitance per unit value varies according to an erosion effect on a dielectric layer.

16. The method according to claim 13 wherein said set of capacitance per unit values comprises a look-up table.

17. The method according to claim 13 wherein said set of capacitance per unit values comprises a mathematical formula.

* * * * *